United States Patent
Hellberg

(10) Patent No.: US 12,334,871 B2
(45) Date of Patent: Jun. 17, 2025

(54) FEEDFORWARD AMPLIFIER

(71) Applicant: Telefonaktiebolaget LM Ericsson (publ), Stockholm (SE)

(72) Inventor: Richard Hellberg, Huddinge (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 520 days.

(21) Appl. No.: 17/800,273

(22) PCT Filed: Feb. 21, 2020

(86) PCT No.: PCT/SE2020/050205
§ 371 (c)(1),
(2) Date: Aug. 17, 2022

(87) PCT Pub. No.: WO2021/167508
PCT Pub. Date: Aug. 26, 2021

(65) Prior Publication Data
US 2023/0075926 A1    Mar. 9, 2023

(51) Int. Cl.
*H03F 3/21* (2006.01)
*H03F 1/02* (2006.01)
*H03F 1/32* (2006.01)

(52) U.S. Cl.
CPC .............. *H03F 1/02* (2013.01); *H03F 1/3223* (2013.01); *H03F 3/211* (2013.01)

(58) Field of Classification Search
CPC ...... H03F 1/02; H03F 3/211; H03F 2200/192; H03F 2200/201; H03F 2200/204;
(Continued)

(56) References Cited

U.S. PATENT DOCUMENTS

| 5,831,478 A | 11/1998 | Long |
| 5,977,826 A * | 11/1999 | Behan ...................... H03F 1/30 330/149 |
| 6,127,889 A * | 10/2000 | Myer ..................... H03F 1/3235 330/149 |

(Continued)

FOREIGN PATENT DOCUMENTS

| CN | 1444411 A | 9/2003 |
| CN | 105227146 A | 1/2016 |

(Continued)

OTHER PUBLICATIONS

International Search Report and Written Opinion of the International Searching Authority for PCT International Application No. PCT/SE2020/050205 dated Nov. 3, 2020.

(Continued)

*Primary Examiner* — Andrea Lindgren Baltzell
*Assistant Examiner* — Khiem D Nguyen
(74) *Attorney, Agent, or Firm* — Sage Patent Group

(57) ABSTRACT

A feedforward amplifier comprises a power amplifier that generates an amplified signal, an error correcting circuitry that generates a first error signal and a second error signal based on an error in the amplified signal; and an output circuitry. The output circuitry comprises: a first quadrature coupler, an output of a first error amplifier is connected to the quadrature coupler and an input of the first error amplifier is configured to receive the first error signal, and an output of a second error amplifier is connected to the quadrature coupler and an input of the second error amplifier is configured to receive the second error signal. The output circuitry generates an error compensation signal in the first quadrature coupler from the output signals of the first and second error amplifiers.

9 Claims, 4 Drawing Sheets

(58) Field of Classification Search
CPC ......... H03F 2200/321; H03F 2200/451; H03F 2201/3218; H03F 1/3223; H03F 3/19; H03F 3/24
USPC ............ 330/151, 149, 84, 124 R; 455/114.3; 375/296, 297; 341/118, 119
See application file for complete search history.

(56) References Cited

U.S. PATENT DOCUMENTS

2018/0167032 A1 6/2018 Jeon et al.
2019/0165746 A1 5/2019 Hellberg

FOREIGN PATENT DOCUMENTS

EP   1309082 A2   5/2003
WO   2017082776 A1   5/2017

OTHER PUBLICATIONS

Choi et al., "Dual-band Feedforward Linear Power Amplifier Using Equal Group Delay Signal Canceller," Proceedings of Asia-Pacific Microwave Conference 2007, 4 pages.
Shepphard et al., "An Efficient Broadband Reconfigurable Power Amplifier Using Active Load Modulation," IEEE Microwave and Wireless Components Letters, vol. 26, No. 6, Jun. 2016, pp. 443-445.
Seidel, "A Microwave Feed-Forward Experiment," The Bell System Technical Journal, vol. 50, No. 9, Nov. 1971, 38 pages.
Office Action for Chinese Patent Application No. 202080091647.3 dated Aug. 30, 2024, 7 pages.

* cited by examiner

FEEDFORWARD AMPLIFIER

CROSS REFERENCE TO RELATED APPLICATION

This application is a 35 U.S.C. § 371 national stage application of PCT International Application No. PCT/SE2020/050205 filed on Feb. 21, 2020, the disclosure and content of which is incorporated by reference herein in its entirety.

TECHNICAL FIELD

The present disclosure relates to feedforward amplifiers. More particularly the invention pertains to error correction or control in the feedforward amplifiers. Furthermore, radio network nodes and user equipment in wireless communication systems, and electronic devices in general comprising the amplifier circuit are disclosed.

BACKGROUND

Power amplifiers are widely used for example in radio base stations and user equipment in wireless communication systems. Power amplifiers typically amplify input signals of high frequencies into an output signal ready for radio transmission. High efficiency and linearity are generally desirable for power amplifiers to reduce power consumption and minimize errors and/or distortions in the output signal.

The error or distortion correction techniques commonly applicable for power amplifiers include feedback, pre-distortion and feedforward techniques. Of these, only so called adaptive pre-distortion and feedforward techniques are viable for systems having wide bandwidth and with tough linearity requirements.

Adaptive pre-distortion, typically used in digital implementations, is a linearization technique that works by providing an inversely nonlinear signal to the input of a nonlinear amplifier so that the output signal becomes linear. To shape the nonlinear input signal to the amplifier, the adaptive pre-distortion technique uses sampling of the amplifier's output signal together with nonlinear modeling and adaptive signal processing. A major benefit of this technique is that the efficiency of the amplifier is almost unaffected.

However, the adaptive digital pre-distortion technique cannot counteract noise and handles several types of distortion poorly, or not at all. The pre-distortion signal generally has much higher bandwidths than the final output signal, especially for compression, low or negative gain slope regions and sharp kinks in the transfer function. Digital pre-distortion systems need a correct set of model parameters, which sometimes is hard to determine. A specific set of model parameters might not work in practice if the produced amplifiers behave differently than the model. The signal processing complexity, and consequentially the size and power consumption, can be high for complex error processes. These problems are exacerbated by requirements for high bandwidths and low distortion.

Feedforward is a linearization technique that works by injecting a corrective signal after a main amplifier to restore linearity.

A directional coupler has close to zero coupling loss for injected signals that are in phase with and proportional, by a coupling factor, to the output signal from the main amplifier, but has high loss for injected signals that are far away from these conditions. Even if the error in the output signal is zero, the directional coupler dumps part of the output signal power from the main amplifier into a resistance. It however does not have a specific penalty for signals with low amplitude in the main path, since the error amplifier is isolated from it by the directional coupler. Furthermore, the average efficiency of the error amplifier is low if the error in the output signal is small on average compared to the maximum error.

Transformer coupling has no such inherent coupling loss but influences the efficiency of the error amplifier and messes up the correction due to a backward going (reverse) wave. The reverse wave reflects at and interacts with the main amplifier which gives rise to new distortion products and ripple in the output. Due to these problems the transformer coupling method has largely been abandoned in favor for the directional coupler method.

Feedforward with the distributed amplifier error injection method overcomes the drawbacks of transformer coupling by having good directivity and has lower insertion loss than the traditional directional coupler based method. Its main drawback is that the number of amplifiers increases with the bandwidth and directivity requirements, especially if only a single size of amplifier is available.

SUMMARY

It is an object of the present disclosure to mitigate, alleviate or eliminate one or more of the above-identified deficiencies and disadvantages in the prior art and solve at least the above mentioned problems. An object of embodiments herein is therefore to provide an improved amplifier circuit for error or distortion correction of a signal output from a circuit, such as a main amplifier as mentioned above.

This object is achieved by a feedforward amplifier for amplifying an input signal received at an input port and providing an output signal at an output port. The feedforward amplifier comprises: at least one power amplifier configured to receive the input signal and to generate an amplified signal; an error correcting circuitry configured to generate a first error signal and a second error signal based on an error in the amplified signal created when amplifying the input signal; and an output circuitry.

The output circuitry comprises: a first quadrature coupler having a first port configured to receive the amplified signal, a second port configured to generate the output signal, a third port and a fourth port; and a first error amplifier and a second error amplifier. An output of the first error amplifier is configured to be connected to the third port and an input of the first error amplifier is configured to receive the first error signal. An output of the second error amplifier is configured to be connected to the fourth port and an input of the second error amplifier is configured to receive the second error signal.

The output circuitry is configured to generate an error compensation signal in the first quadrature coupler from the output signal of the first error amplifier and the output signal of second error amplifier, and the error compensation signal is synchronized and in anti-phase with the error in the amplified signal.

An advantage with the feedforward amplifier circuit according to embodiments herein is that it simultaneously achieves low insertion loss of the transformer coupling circuit and good large-scale correction ability. It has high efficiency for errors with high peak-to average power ratio and for compression errors. Correction over large bandwidths can be achieved with retained directivity by using multi-section hybrid couplers. The output circuitry uses only two RF amplifiers of a single size, even for large bandwidths.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION

Figure 1:
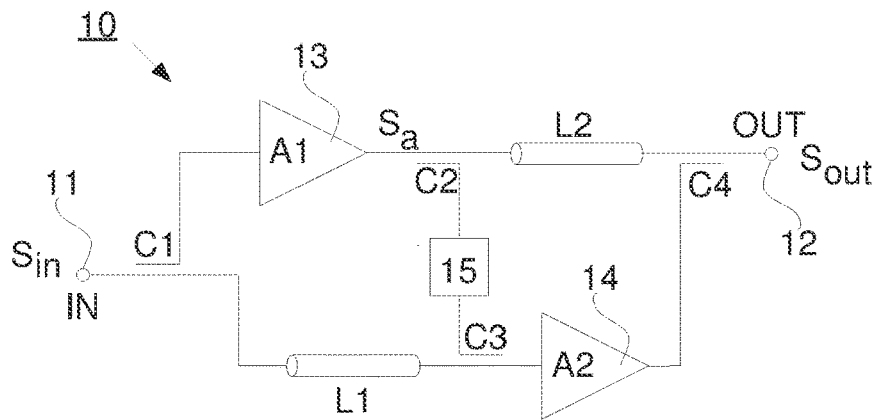
FIG. 1 shows a feedforward amplifier circuit of a prior art.

Aspects of the present disclosure will be described more fully hereinafter with reference to the accompanying drawings. The circuit and method disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

Some of the example embodiments presented herein are directed towards error correction or control in an output of a feedforward amplifier. As part of the development of the example embodiments presented herein, a problem will first be identified and discussed.

The conventional directional coupler method, as described in connection with FIG. 1, generally has higher relative efficiency for errors occurring at low output amplitudes, whereas a balanced error amplifier has higher efficiency for errors occurring at high output amplitudes. The conventional method has low efficiency if it needs capability for large errors, whereas the embodiment of the present disclosure has high efficiency in such situations as long as the errors at low output amplitudes are small. Therefore, the balanced error amplifier and the directional coupler method complement each other and can in many cases be used together with higher efficiency than either method by itself. In such combinations, the embodiments of the disclosure can be used to remove larger errors, for example transients and compression while the conventional method can remove small errors at low amplitudes.

The feedforward of the present disclosure can also be used together with predistortion. Predistortion generally handles distortion at low amplitudes well and does not degrade the efficiency of the amplifier. It however has trouble with transient phenomena and large compression, which the invention handles well. The feedforward amplifier of the present disclosure can be placed either inside or outside the predistortion loop. If it is placed inside, its error signal can advantageously be suppressed in the low amplitude region for small errors. If it is placed outside the loop, the predistorter can instead ignore compression and transients. It can also be simplified in other ways since the embodiments of the disclosure handles complicated small-scale errors as well.

Any of the described combinations can of course also be complemented with more stages of error correction as required.

FIG. 1 shows a feedforward amplifier circuit 10 of a prior art. The feedforward amplifier circuit 10 is configured to amplify an input signal $S_{in}$ provided to an input port 11 via an initial directional coupler C1 and outputting an output signal $S_{out}$ at an output port 12. The circuit 10 performs the amplification process by injecting a corrective signal after a main amplifier 13 via a final directional coupler C4 to restore linearity. It can handle all types of distortion, noise, and other imperfections and can do this without knowledge of the specific error processes involved. The circuit 10 includes an error extraction circuitry, which includes a first directional coupler C2 configured to sample an amplified signal $S_a$, an optional adjustment circuitry 15 configured to adjust the gain or phase of the sampled amplified signal, and a second directional coupler C3 configured to compare the sampled amplified signal $S_a$ with the input signal $S_{in}$. In order to maintain synchronisation during error extraction, the input signal ($S_{in}$) is delayed by a first delay filter L1. This delay ensures that the input signal Sin is in sync with the amplified signal $S_a$ to create an error extraction signal. The error extraction signal is amplified by a secondary amplifier 14 and injected to the final directional coupler C4. A second delay filter (L2) is provided after the main amplifier 13 to maintain the amplified signal $S_a$ to be in sync with the error signal that is injected before the output port 12.

However, a drawback of a conventional feedforward method described above has low efficiency, as illustrated in connection with FIG. 9. This is to a large extent due to losses in the error injection coupler and low efficiency of the error amplifier. Usually, large losses in the error injection coupler and low efficiency in the error amplifier, i.e. the secondary amplifier 14, will result if the maximum error signal, either in voltage or current, needs to be handled is large. These losses behave differently for transformer couplers and directional couplers. Other causes such as losses and inefficiency are due to the delay in a line after the main amplifier, the signal sampling couplers, and limited precision in loop balancing with respect to gains, phases and delays. This means that the error amplifiers must have headroom to accommodate residual signal instead of only the error signal.

According to some aspects of the feedforward amplifier circuit 20 achieves feedforward error correction with low insertion loss and good large-scale correction ability. It has a high efficiency for errors with high peak-to average power ratio and for compression errors. Correction over large bandwidths can be achieved with retained directivity by using multi-section hybrid couplers. It uses only two amplifiers of a single size, even for large bandwidths.

Figure 2:
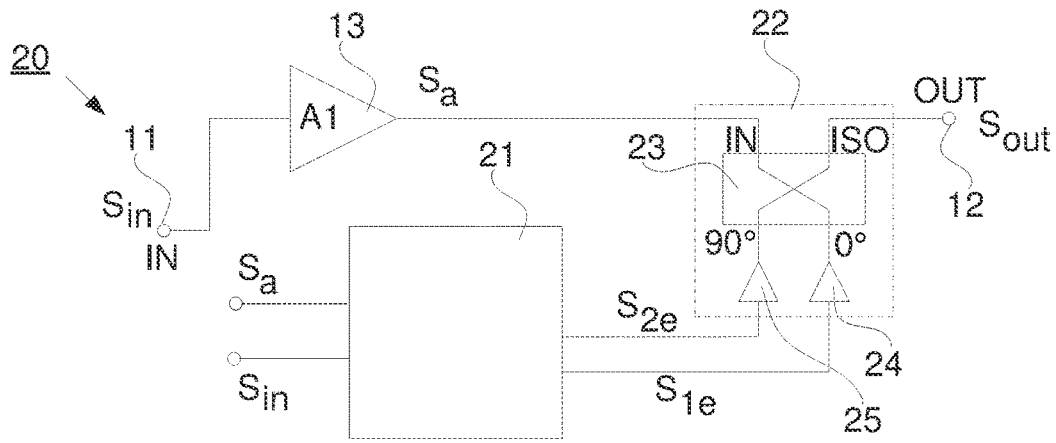
FIG. 2 illustrates an general example of a feedforward amplifier according to the present disclosure.

FIG. 2 illustrates a general example of a feedforward amplifier 20 for amplifying an input signal $S_{in}$ provided to an input port 11 and outputting an output signal Sout at an output port 12. The feedforward amplifier 20 provides a feedforward amplification of the input signal Sin to subtract an error signal from the main amplifier 13. The feedforward amplifier 20 comprises at least one power amplifier as the main amplifier 13, an error correcting circuitry 21, and an output circuitry 22. The at least one power amplifier 13 is configured to receive the input signal $S_{in}$ from the input port 11 and to generate an amplified signal $S_a$.

Figure 3:
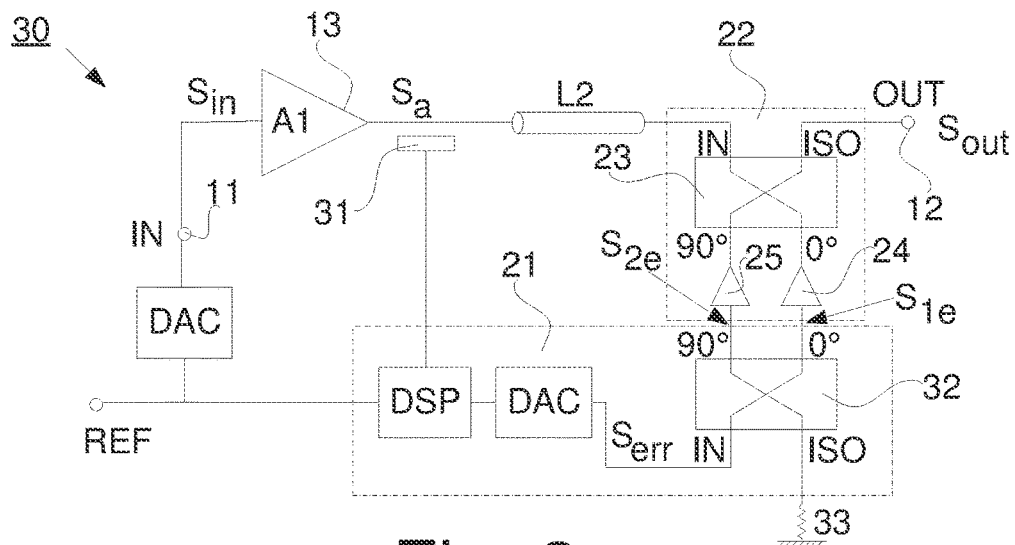
FIG. 3 illustrates an example feedforward amplifier, in accordance with an embodiment of the present disclosure.
Figure 4:
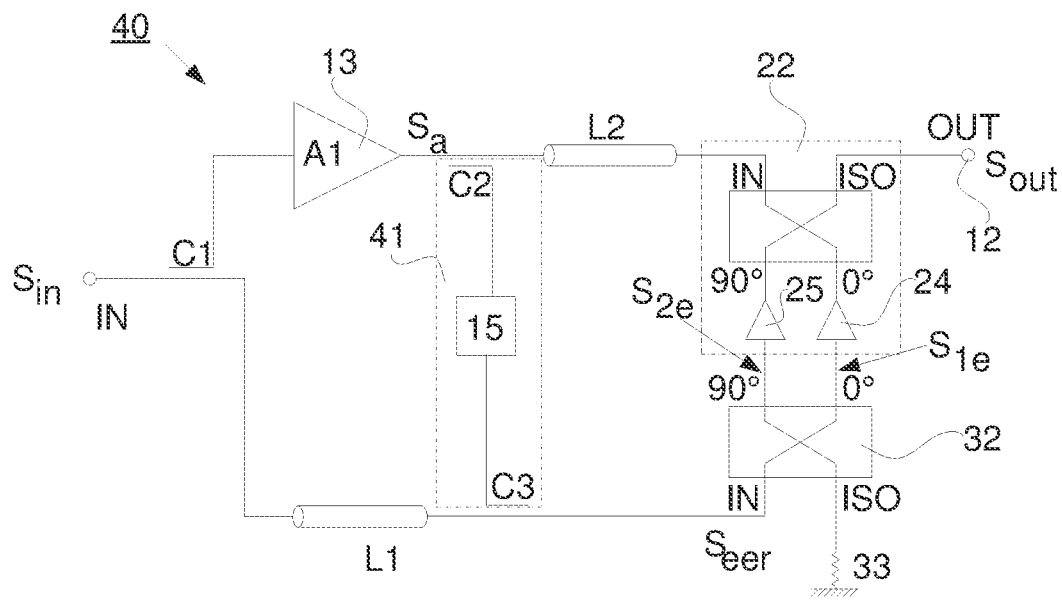
FIG. 4 illustrates an example of a feedforward amplifier with two steps extraction of the error signal.
Figure 5:
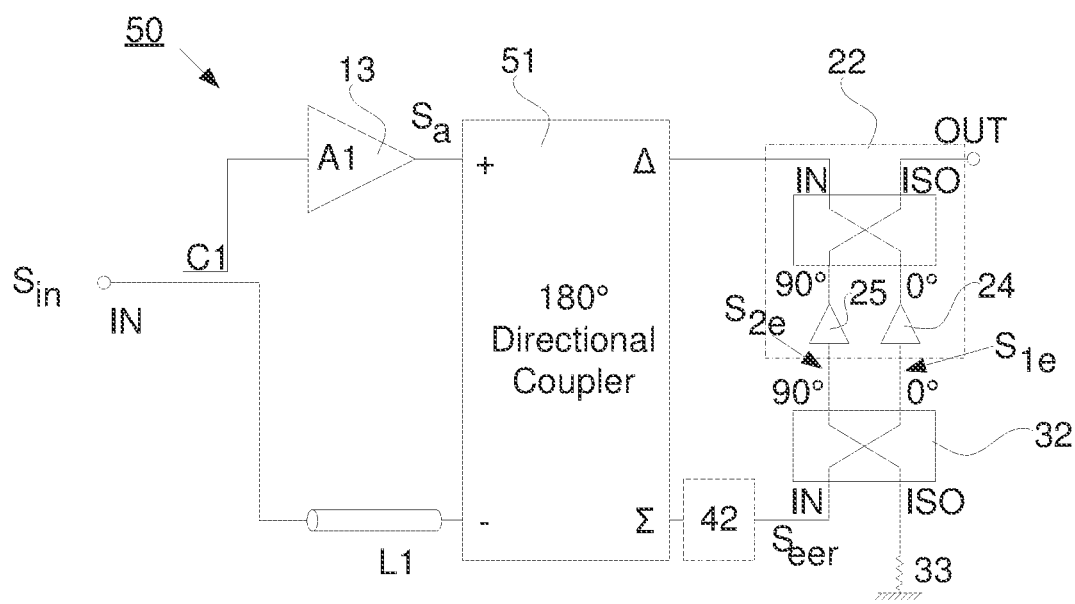
FIG. 5 illustrates an example feedforward amplifier, in accordance with another embodiment of the present disclosure.

The error correcting circuitry 21 is configured to generate a first error signal $S_{1e}$ and a second error signal $S_{2e}$ based on the input signal Sin and the amplified signal Sa. The first error signal $S_{1e}$ is in anti-phase with the amplified signal $S_a$, and the second error signal $S_{2e}$ is 90 degrees out of phase with the first error signal $S_{1e}$. In this disclosure, the expression related to a first signal that is in anti-phase with a second signal means that the first signal is 180 degrees phase-shifted compared to the second signal. According to some embodiments, the first error signal $S_{1e}$ and a second error signal $S_{2e}$ have the same amplitude, either generated within the error correcting circuitry 21, or generated from an error signal $S_{err}$ using a splitting arrangement, such as a second quadrature coupler 32 as illustrated in FIGS. 3-5. The function of the splitting arrangement is to split the error signal $S_{err}$ into two signals (corresponding to the first error signal $S_{1e}$ and a second error signal $S_{2e}$, having the same amplitude and with a 90 degree phase shift there between.

The output circuitry 22 comprises a first quadrature coupler 23, also called unterminated 90-degree 3-dB coupler, with two connected RF amplifiers 24 and 25 as error amplifiers. The first quadrature coupler 23 has a first port, marked "IN", configured to receive the amplified signal $S_a$, a second port, marked "OUT", configured to generate the output signal $S_{out}$, a third port, marked "0°", and a fourth port, marked "90°". An output of the first error amplifier 24 is configured to be connected to the third port 0° of the quadrature coupler and an input of the first error amplifier 24 is configured to receive the first error signal $S_{1e}$. An output of the second error amplifier 25 is configured to be connected to the fourth port 90° and an input of the second error amplifier 25 is configured to receive the second error signal $S_{2e}$.

According to some embodiments, the feedforward amplifier further comprises at least a second delay line L2 to compensate for delay in the error correcting circuitry.

The quadrature coupler 23 together with the error amplifiers 24 and 25 lets the amplified signal $S_a$ pass through with very little loss. This is due to the fact that surrounding components, biassing and signal levels typically will result in a high reflection coefficient at the output side of the error amplifiersSignals entering the first port IN will split and reflect at the two amplifier outputs (connected to the third port 0° and fourth port 90°) and thereafter combine within the quadrature coupler to exit at the remaining port, i.e. second port ISO, which is coupled to the load (not shown). The functionality that the combined signal exits at the remaining port and does not reflect to the same port (the first port IN) is guaranteed by the operation of the quadrature coupler. In absence of a corrective output from the error amplifiers 24 and 25, the main amplifier's output signal, i.e. the amplified signal, will thus pass through largely unaffected through delay line L2 and quadrature coupler 23, except for filtering effects such as group delay and phase response and exit at the output port OUT.

According to some embodiments, the resulting reflection coefficient on the output side of the error amplifiers is more than 95%.

The output circuitry is further configured to generate an error compensation signal in the first quadrature coupler 23 from the output signal of the first error amplifier 24 and the output signal of second error amplifier 25. Whereby, the error compensation signal is synchronized and in anti-phase with the error in the amplified signal $S_a$. When input signals to the error amplifiers 24 and 25 have a 90 degree phase difference they will combine at the output port OUT of the quadrature coupler 23, thereby generating the error compensation signal when they combine. However, imperfect phasing will cause a part of the signal to exit at the first port IN and travel back towards the main amplifier 13.

The architecture and function of the quadrature coupler (such as the first quadrature coupler 23) is explained in details later in reference to FIGS. 6a and 6b. The first quadrature coupler 23 splits the amplified signal $S_a$ into two equal parts. This is also referred as backwards coupler which means that a wave coupled from one line (from port 1 to port 3) to another line (from port 2 to port 4) goes in the opposite direction, see FIG. 6a. The wave coupled to the other line also has a 90 degrees phase delay to the wave going the direct path on the input line. A signal coming in at one port will thus be split to two other ports with half of the power at each and with a 90 degree phase difference between them. For example, a signal entering at the first port IN will exit with half the power at the third port 0° and the other half 90 degrees behind at the fourth port 90°. In an embodiment, the first quadrature coupler 23 is a branchline coupler, see FIG. 6b. The terms quadrature coupler, 90-degree 3-dB hybrid coupler and hybrid coupler will be used interchangeably throughout the description and will refer to the quadrature coupler.

FIG. 3 illustrates an embodiment of a feedforward amplifier 30, wherein the error correcting circuitry 21 comprises a digital signaling processor, DSP, configured to obtain a sample of the amplified signal using a sensor 31 and at least one digital to analogue converter, DAC, to generate the error signal $S_{err}$. The DSP may use a reference input signal REF to generate the error signal $S_{err}$. Also, a corresponding input signal $S_{in}$, is in this example generated using a Digital to Analog Converter DAC before being introduced to input port 11. The sensor 31 may digitally sample the amplified signal $S_a$ that is used by the DSP to generate the error signal.

The error correcting circuitry 21 further comprises a splitting arrangement, illustrated as a second quadrature coupler 32, having a first port, marked "IN", configured to receive an error signal $S_{eer}$, a second port, marked "ISO" that is connected to ground via a load 33, a third port, marked "0°", configured to provide the first error signal $S_{1e}$ to the input of the first amplifier 24 and a fourth port, marked "90°", configured to provide the second error signal $S_{2e}$ to the input of the second amplifier 25. The second quadrature coupler 32 splits the error signal $S_{err}$ into two equal parts. When the error signal enters at the first port IN, the first error signal $S_{1e}$ will exit with half the power at the third port 0° and the other half 90 degrees behind at the fourth port 90° as the second error signal $S_{2e}$. The second quadrature coupler 32 is a convenient way of splitting a signal into two signals with equal amplitude and with a 90 degree phase difference, but this may be performed in multiple known ways, as is obvious for a skilled person.

In an alternative embodiment (not shown) the DSP is configured to generate the first error signal $S_{1e}$ and the second error signal $S_{2e}$ digitally and to provide the respective corresponding analogue error signal via a DAC directly to the respective error amplifier 24 and 25, thereby omitting the need for the second quadrature coupler 32.

According to some embodiment, surrounding components, biassing and signal levels are chosen to give the first amplifier 24 and the second amplifier 25 a high reflection coefficient, above 95% is desired. In an embodiment, the first amplifier 24 and the second amplifier 25 are preferably identical in configuration and operations to obtain a similar results for a given input.

The error signal can be extracted in a single step or in two separate steps which will be described later in reference to FIGS. 4 and 5.

FIG. 4 illustrates an example of a feedforward amplifier 40 with two steps extraction of the error signal. The feedforward amplifier 40 comprises at least one power amplifier 13, an error extraction circuitry 41, a first delay line L1 and a second delay line L2 and an output circuitry 22. Alternatively, the delay line L2 may be replaced by a delay filter, similar to the delay filter 42 in FIG. 5. The error correcting circuitry comprises the error extraction circuitry 41 configured to sample the amplified signal $S_a$, and to compare it with the input signal $S_{in}$ to generate the error signal $S_{err}$. The error is extracted and inserted in two steps in the error extraction circuitry 41. In a first step the main amplifier signal is tapped off by a first directional coupler C2. The signal is processed by the phase adjusting circuitry 15, which represents other amplitude/phase adjusting means that are commonly used in feedforward systems. The signal is compared to the input signal $S_{in}$ which is delayed using delay line L1, in a second directional coupler C3. The error signal is then fed to a splitting arrangement, e.g. a 90-degree 3-dB hybrid coupler 32, which splits the error signal to generate the first error signal $S_{1e}$ and the second error signal $S_{2e}$ wherein the first error signal $S_{1e}$ is in anti-phase with the amplified signal $S_a$ and the second error signal S2e is 90 degrees out of phase with the first error signal $S_a$.

The error extraction circuitry 41 comprises a first directional coupler C2 configured to sample the amplified signal $S_a$, an adjustment circuitry 15 configured to adjust the gain or phase of the sampled amplified signal, and a second directional coupler C3 configured to compare the sampled amplified signal with the input signal.

The feedforward amplifier further comprises the first delay line L1 to compensate for delay in the main amplifier 13, and a second delay line L2 to compensate for delay in the error extraction circuitry 41 and second quadrature coupler 32. According to some embodiments the feedforward amplifier comprises a delay filter 42, which is another implementation of a delay line. If a delay filter 42 is implemented, then the delay line L2 may be omitted.

According to FIG. 4, the output signal from first amplifier 24 entering the first quadrature coupler 22 at the fourth port 90° thus has a direct path to the second port ISO while the output signal from second amplifier 25 entering the first quadrature coupler 22 at the third port 0° has a coupled path and thus has 90 degrees more phase shift in its path. If the input signals to the amplifiers 24 and 25 are phased oppositely, with the amplifier 25 being excited 90 degrees behind the amplifier 24, the two output signals from the amplifiers 24 and 25 will be in the same phase at the second port ISO and generate the error compensation signal. Likewise, the two 90 degree phase differences will add to 180 degrees at the first port IN, which means that the otherwise identical signals will cancel, thereby minimizing the portion of the power that is sent back towards the main amplifier, while at the same time maximizing the corrective capability in the forward direction.

The low loss in the path from the main amplifier 13 to the output depends on a split, reflect and recombine operation. The amplified signal Sa enters the first port IN of the hybrid coupler 23. The amplified signal $S_a$ is split and half goes the direct path to the output of the amplifier 24 at the third port 0°. The other half couples backwards and comes with an extra 90 degree phase delay to the amplifier 25 at the fourth port 90°. The reflected signals that (re-)enter the ports, 0° and 90°, are combined. In total, this means that the reflected parts combine in phase at the third port ISO and in anti-phase at the input port IN.

FIG. 5 illustrates an example feedforward amplifier 50 with a single step extraction of the error signal. The feedforward amplifier 50 includes at least one power amplifier 13. The at least one power amplifier 13 receives the input signal $S_{in}$ to generate an amplified signal $S_a$.

Figures 7A, 7B:
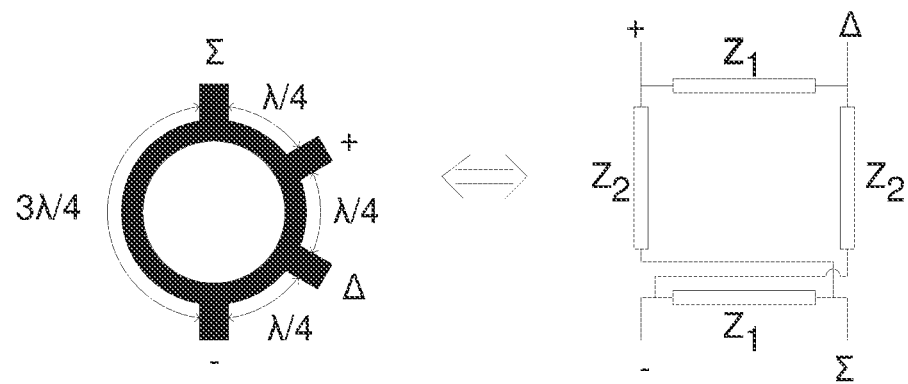
FIGS. 7a and 7b illustrate two example architectures of a 180° directional coupler.

The feedforward amplifier 50 comprises an error extraction circuitry 51, a second quadrature coupler 32 (i.e. splitting arrangement) and an output circuitry 22. The error extraction circuitry 51 comprises a 180° directional coupler (as shown in FIGS. 7a and 7b) having a first port, marked "+", configured to receive the amplified signal $S_a$, a second port, marked "Δ", configured to output the amplified signal to the first port IN of the first quadrature coupler 23, a third port, marked "−", configured to receive the input signal $S_{in}$ via a delay line L1, and a fourth port, marked Σ, configured to output the error signal $S_{err}$ to the first port IN of the second quadrature coupler 32, optionally via a delay filter 42.

In this embodiment, the error correcting circuitry comprises the error extraction circuitry, the second quadrature coupler 32 and optionally the delay filter 42. As mentioned above, the single-step extraction typically uses a single 180-degree directional coupler instead of the two directional couplers C2 and C3 used in the error extraction circuitry 41 in FIG. 4. Depending on the relative phases of the output and the reference either the 0-degree (marked with Σ) or the 180-degree (marked with Δ) port output is used as the error signal $S_{err}$.

The purpose of the delay filter 42 is to synchronize the amplified first error correction signal $S_{1e}$ at the output of the first amplifier 24 to be in anti-phase with the amplified signal $S_a$ at the third port 0° of the first quadrature coupler 23. In an embodiment, synchronisation, or matching, may be implemented in different ways such as delay lines, inverter, gain phase adjuster, depending on the implementation.

Figures 6A, 6B:
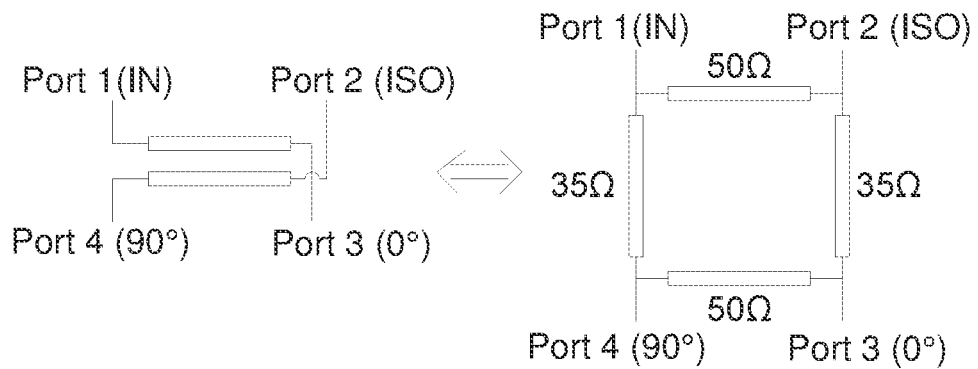
FIGS. 6a and 6b illustrate two example architectures of a 90-degree 3-dB hybrid coupler, in accordance with an embodiment of the present disclosure.

FIGS. 6a and 6b illustrate two example architectures of a quadrature coupler, or 90-degree 3-dB hybrid coupler, in accordance with an embodiment of the present disclosure. FIG. 6a discloses a quadrature coupler using coupled lines, and FIG. 6b illustrate a quadrature coupler implemented using transmission lines, aka branchline coupler. The quadrature coupler, e.g. used in the output circuitry and in the error correcting circuitry, is a four-port device that is used either to equally split an input signal with a resultant 90° phase shift between output ports or to combine two signals while maintaining high isolation between the ports.

When power is introduced at the first port IN, half the power (3 dB) flows to the third port 0° and the other half is coupled (in the opposite direction) to the fourth port 90°. Reflections from mismatches sent back to the third and fourth ports will flow directly to the second port ISO or cancel at the first port. A signal applied to any port, will result in two equal amplitude signals that are quadrant (90° apart). It also makes no difference which port is the input port because the relationship at the outputs remains the same as these devices are electrically and mechanically symmetrical, which is why the 90-degree 3-dB hybrid coupler is also known as a quadrature coupler.

FIGS. 7a and 7b illustrate two example architectures of a 180° directional coupler, e.g. a 3 dB, 180° Hybrid Ring Coupler. 180° hybrid ring couplers (also called "rat race" couplers) are four-port devices used to either equally split an input signal or to sum two combined signals. The hybrid ring provides equally-split but 180 degree phase-shifted output signals. The center conductor ring is 1 1/2 wavelengths in circumference (or six 1/4 wavelengths) and each port is separated by 90°. This configuration creates a lossless device with low voltage standing wave ratio, VSWR, excellent phase and amplitude balance, high output isolation and match output impedances. The low loss, airline construction also makes the device a perfect choice for combining high power mixed signals.

FIG. 7b illustrate a 180° directional coupler implemented using transmission lines, each having an impedance. If an equal split of the incoming signal at port "+" is desired, the impedance $Z_1$ and $Z_2$ should be the same. This means that in a 50Ω system, each impedance is 70.7Ω($\sqrt{2}$*50Ω). In the present disclosure, the split is uneven with only a part of the incoming signal at + port being coupled to the Σ port compared to the part being coupled to the Δ port. In the general case, the transmission line impedances $Z_1$ are determined using the following equations:

$$Z_1 = Z_0 * \sqrt{1 + p_{div}}$$

$$Z_2 = Z_0 * \sqrt{\frac{1 + p_{div}}{p_{div}}}$$

wherein $Z_0$ is 50Ω in a 50Ω system, and $p_{div}$ is the power relation between the power on the Σ port and power on the Δ port. If the power on the Σ port should be 13 dB lower than the power on the Δ port (representing 1/20 of the power of the incoming signal), then the first transmission impedance $Z_1$ is 51.24Ω and the second transmission impedance $Z_2$ is 228.9Ω.

Figure 8:
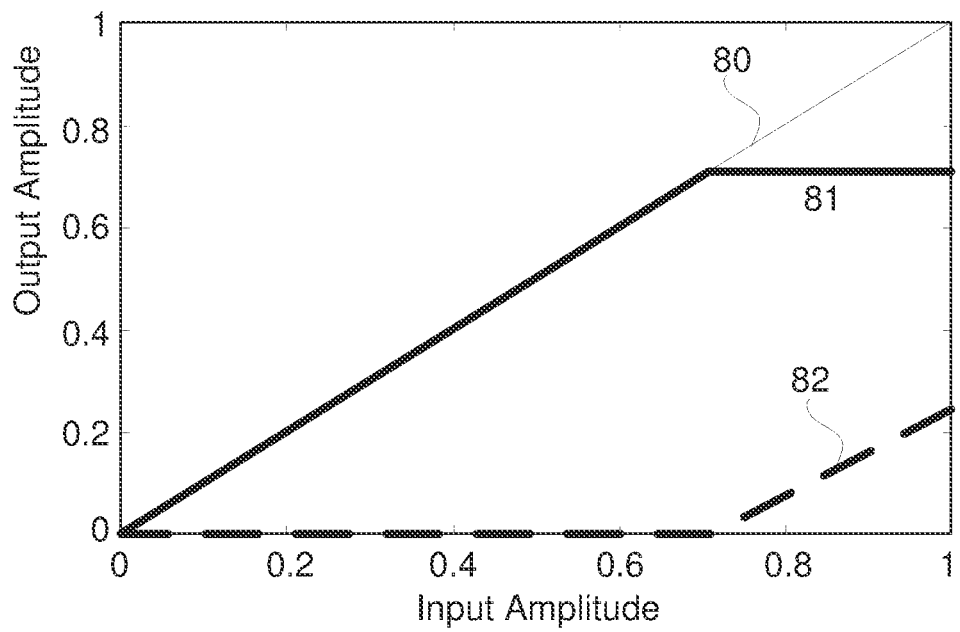
FIG. 8 illustrates the distribution of the desired signal (output), the distorted output from the main amplifier, and the error signal.

FIG. 8 illustrates a graph with input amplitude (of the input signal) as a function of output amplitude (of the output signal). The graph shows a normalized distribution of a desired output signal 80, the distorted output signal 81 corresponding to the amplified signal $S_a$ from the main amplifier, and the error compensation signal 82 generated by combining the amplified first and second error signal in the quadrature coupler 23. The compression of the amplified signal $S_a$ starts at 0.71 of the full amplitude, as represented by 81.

Figure 9:
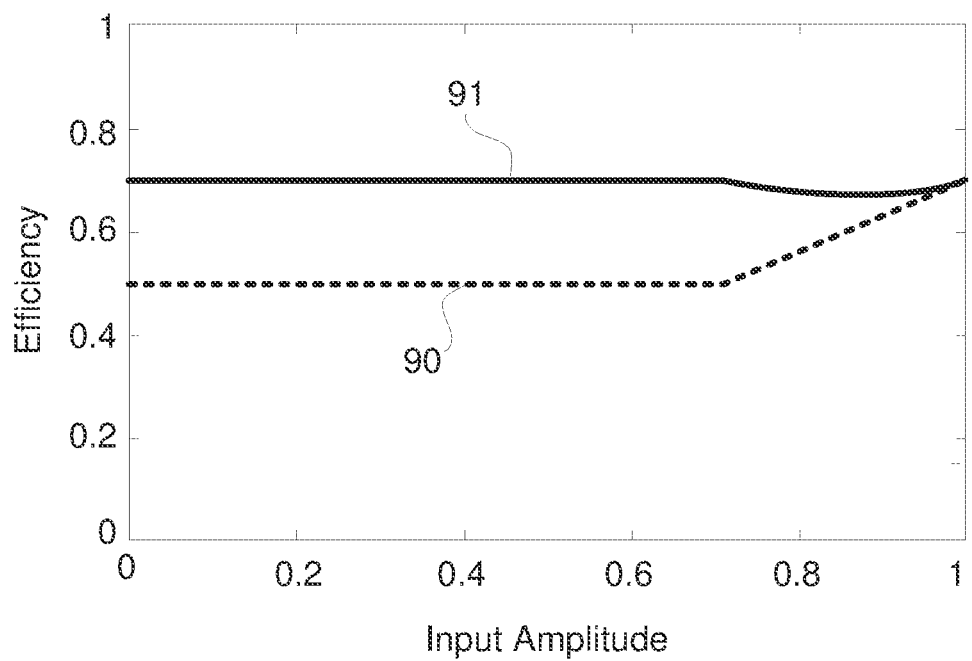
FIG. 9 illustrates a comparison of the outputs as obtained in the prior art amplifier circuit and the feedforward amplifier.

FIG. 9 illustrates a graph with input amplitude (of the input signal) as a function of efficiency η. The graph shows a comparison of an efficiency 90 of the prior art amplifier circuit described in connection with FIG. 1 and an efficiency 91 of the feedforward amplifier described in connection with any of FIGS. 2-5. Thus, the feedforward amplifier according to the described embodiments provides for a situation where the advantage of a feedforward amplifier with an output circuitry 22 is considerable higher over the full amplitude range, especially in the lower amplitude range 0-0.7.

The top curve 91 shows the efficiency of the feedforward amplifiers according to the present invention over the full amplitude range, while the bottom curve 90 shows the efficiency for the prior art feedforward amplifier (without over-dimensioning). The main amplifier is modelled as having constant 70% efficiency at all amplitudes, while the error amplifiers are modelled as having efficiency proportional to RF voltage amplitude, with 70% maximum efficiency. The top curve 91 shows a small downward shift in the upper amplitude range 0.7-1 due to amplifying the error at lower than maximum RF voltage in the balanced error amplifier. The efficiency at maximum amplitude is back at 70%.

An advantage that the invention shares with the directional error amplifier is that the coupler loss is minimized compared to the prior art feedforward amplifier. This is a big advantage when large scale errors such as compression are to be corrected. With the same dimensioning and the same intrinsic efficiency of the component amplifiers, the efficiency of the described embodiments of the disclosure is identical to that of the directional error amplifier-based feedforward. The relative suitability of the embodiments of the disclosure depends on frequency range, availability of transistors and manufacturability and availability of couplers and other passive structures and components.

Due to the large size of the expected error, the coupler loss is very high for the prior art feedforward amplifier, which severely lowers the efficiency at lower amplitudes. The efficiency rises linearly in the upper amplitude range where the error signal increases and reaches 70% only at maximum amplitude where perfect combination in the coupler occurs.

The present disclosure is related to a feedforward amplifier for amplifying an input signal received at an input port and providing an output signal at an output port. The feedforward amplifier comprising: at least one power amplifier configured to receive the input signal and to generate an amplified signal; an error correcting circuitry configured to generate a first error signal and a second error signal based on an error in the amplified signal created when amplifying the input signal; and an output circuitry.

The output circuitry comprises: a first quadrature coupler having a first port configured to receive the amplified signal, a second port configured to generate the output signal, a third port and a fourth port; and a first error amplifier and a second error amplifier. An output of the first error amplifier is configured to be connected to the third port and an input of the first error amplifier is configured to receive the first error signal, and an output of the second error amplifier is configured to be connected to the fourth port and an input of the second error amplifier is configured to receive the second error signal.

The output circuitry is configured to generate an error compensation signal in the first quadrature coupler from the output signal of the first error amplifier and the output signal of second error amplifier, and the error compensation signal is synchronized and in anti-phase with the error in the amplified signal.

According to some embodiments, the error correcting circuitry comprises a splitting arrangement configured to receive and split an error signal into the first error signal and the second error signal, and to provide the first error signal to the input of the first amplifier and to provide the second error signal to the input of the second amplifier.

According to some embodiments, the splitting arrangement comprises a second quadrature coupler having a first port configured to receive the error signal, a second port that is connected to ground via load, a third port configured to provide the first error signal to the input of the first amplifier and a fourth port configured to provide the second error signal to the input of the second amplifier.

According to some embodiments, the feedforward amplifier further comprises at least a first delay line to compensate for delay in the at least one power amplifier.

According to some embodiments, the error correcting circuitry further comprises an error extraction circuitry configured to sample the amplified signal, and to compare it with the input signal to generate the error signal.

According to some embodiments, the feedforward amplifier further comprises at least a second delay line to compensate for delay in the error correcting circuitry.

According to some embodiments, the error extraction circuitry comprises a first directional coupler configured to sample the amplified signal, an adjustment circuitry configured to adjust the gain or phase of the sampled amplified signal, and a second directional coupler configured to compare the sampled amplified signal with the input signal.

According to some embodiments, the error extraction circuitry comprises a 180° directional coupler having a first port configured to receive the amplified signal, a second port configured to output the amplified signal to the first quadrature coupler, a third port configured to receive the input signal and a fourth port configured to output the error signal to the second quadrature coupler.

According to some embodiments, the error correction circuitry further comprises a digital signaling processor, DSP, configured to obtain a sample of the amplified signal using a sensor; and at least one digital to analogue converter, DAC, to generate the first error signal and second error signal.

Aspects of the disclosure are described with reference to the drawings, e.g., block diagrams. It is understood that several entities in the drawings, e.g., blocks of the block diagrams, and also combinations of entities in the drawings, can be implemented by computer program instructions, which instructions can be stored in a computer-readable memory, and also loaded onto a computer or other programmable data processing apparatus. Such computer program instructions can be provided to a processor of a general purpose computer, a special purpose computer and/or other programmable data processing apparatus to produce a machine, such that the instructions, which execute via the processor of the computer and/or other programmable data processing apparatus, create means for implementing the functions/acts specified in the block diagrams or blocks.

In the drawings and specification, there have been disclosed exemplary aspects of the disclosure. However, many variations and modifications can be made to these aspects without substantially departing from the principles of the present disclosure. Thus, the disclosure should be regarded as illustrative rather than restrictive, and not as being limited to the particular aspects discussed above. Accordingly, although specific terms are employed, they are used in a generic and descriptive sense and not for purposes of limitation.

The description of the example embodiments provided herein have been presented for purposes of illustration. The description is not intended to be exhaustive or to limit example embodiments to the precise form disclosed, and modifications and variations are possible in light of the above teachings or may be acquired from practice of various alternatives to the provided embodiments. The examples discussed herein were chosen and described in order to explain the principles and the nature of various example embodiments and its practical application to enable one skilled in the art to utilize the example embodiments in various manners and with various modifications as are suited to the particular use contemplated. The features of the embodiments described herein may be combined in all possible combinations of methods, apparatus, modules, systems, and computer program products. It should be appreciated that the example embodiments presented herein may be practiced in any combination with each other.

It should be noted that the word "comprising" does not necessarily exclude the presence of other elements or steps than those listed and the words "a" or "an" preceding an element do not exclude the presence of a plurality of such elements. It should further be noted that any reference signs do not limit the scope of the claims, that the example embodiments may be implemented at least in part by means of both hardware and software, and that several "means", "units" or "devices" may be represented by the same item of hardware.

The various example embodiments described herein are described in the general context of method steps or processes, which may be implemented in one aspect by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims. The embodiments herein are not limited to the above described embodiments. Therefore, the above embodiments should not be taken as limiting the scope of the invention or disclosure, which is defined by the appending claims.

The invention claimed is:

1. A feedforward amplifier for amplifying an input signal received at an input port and providing an output signal at an output port, the feedforward amplifier comprising:
   at least one power amplifier configured to receive the input signal and to generate an amplified signal;
   an error correcting circuitry configured to generate a first error signal and a second error signal based on an error in the amplified signal created when amplifying the input signal; and
   an output circuitry comprising:
      a first quadrature coupler having a first port configured to receive the amplified signal, a second port configured to generate the output signal, a third port and a fourth port; and
      a first error amplifier and a second error amplifier, wherein an output of the first error amplifier is configured to be connected to the third port and an input of the first error amplifier is configured to receive the first error signal, and wherein an output of the second error amplifier is configured to be connected to the fourth port and an input of the second error amplifier is configured to receive the second error signal;

wherein the output circuitry is configured to generate an error compensation signal in the first quadrature coupler from the output signal of the first error amplifier and the output signal of second error amplifier, the error compensation signal is synchronized and in anti-phase with the error in the amplified signal.

2. The feedforward amplifier according to claim 1, wherein the error correcting circuitry comprises a splitting arrangement configured to receive and split an error signal into the first error signal and the second error signal, and to provide the first error signal to the input of the first amplifier and to provide the second error signal to the input of the second amplifier.

3. The feedforward amplifier according to claim 2, wherein the splitting arrangement comprises a second quadrature coupler having a first port configured to receive the error signal, a second port that is connected to ground via load, a third port configured to provide the first error signal to the input of the first amplifier and a fourth port configured to provide the second error signal to the input of the second amplifier.

4. The feedforward amplifier according to claim 1, wherein the feedforward amplifier further comprises at least a first delay line to compensate for delay in the at least one power amplifier.

5. The feedforward amplifier according to claim 1, wherein the error correcting circuitry further comprises an error extraction circuitry configured to sample the amplified signal, and to compare it with the input signal to generate the error signal.

6. The feedforward amplifier according to claim 5, wherein the feedforward amplifier further comprises at least a second delay line to compensate for delay in the error correcting circuitry.

7. The feedforward amplifier according to claim 5, wherein the error extraction circuitry comprises a first directional coupler configured to sample the amplified signal, an adjustment circuitry configured to adjust the gain or phase of the sampled amplified signal, and a second directional coupler configured to compare the sampled amplified signal with the input signal.

8. The feedforward amplifier according to claim 5, wherein the error extraction circuitry comprises a 180° directional coupler having a first port configured to receive the amplified signal, a second port configured to output the amplified signal to the first quadrature coupler, a third port configured to receive the input signal and a fourth port configured to output the error signal to the second quadrature coupler.

9. The feedforward amplifier according to claim 1, wherein the error correction circuitry further comprises a digital signaling processor, DSP, configured to obtain a sample of the amplified signal using a sensor; and at least one digital to analogue converter, DAC, to generate the first error signal and second error signal.

* * * * *